US008648357B2

(12) United States Patent
Herrmann (10) Patent No.: US 8,648,357 B2
(45) Date of Patent: Feb. 11, 2014

(54) RADIATION-EMITTING DEVICE

(75) Inventor: Siegfried Herrmann, Neukirchen (DE)

(73) Assignee: OSRAM Opto Semiconductor GmbH, Regensburg (DE)

( * ) Notice: Subject to any disclaimer, the term of this patent is extended or adjusted under 35 U.S.C. 154(b) by 890 days.

(21) Appl. No.: 12/747,459

(22) PCT Filed: Dec. 3, 2008

(86) PCT No.: PCT/DE2008/002026
§ 371 (c)(1),
(2), (4) Date: Jun. 10, 2010

(87) PCT Pub. No.: WO2009/076933
PCT Pub. Date: Jun. 25, 2009

(65) Prior Publication Data
US 2010/0264843 A1    Oct. 21, 2010

(30) Foreign Application Priority Data

Dec. 14, 2007 (DE) .......................... 10 2007 060 257
Mar. 7, 2008 (DE) .......................... 10 2008 013 030

(51) Int. Cl.
*H01L 27/15* (2006.01)
(52) U.S. Cl.
USPC ............... 257/88; 372/22; 372/87; 313/499; 706/38; 348/45; 348/E13.014; 136/201; 136/206; 250/351; 257/E33.005
(58) Field of Classification Search
USPC ............ 372/50.124, 22, 87; 257/99; 235/492; 313/499
See application file for complete search history.

(56) References Cited

U.S. PATENT DOCUMENTS

| 7,932,526 | B2 | 4/2011 | Windisch et al. |
| 2006/0027820 | A1 | 2/2006 | Cao |
| 2006/0043200 | A1* | 3/2006 | Puschner et al. .............. 235/492 |
| 2007/0153867 | A1* | 7/2007 | Muller ..................... 372/50.124 |
| 2007/0158659 | A1 | 7/2007 | Bensce |
| 2008/0179622 | A1 | 7/2008 | Herrmann |
| 2009/0065800 | A1 | 3/2009 | Wirth et al. |
| 2009/0173961 | A1* | 7/2009 | Windisch et al. ............... 257/99 |
| 2010/0072500 | A1 | 3/2010 | Herrmann |
| 2010/0163915 | A1 | 7/2010 | Herrmann et al. |

FOREIGN PATENT DOCUMENTS

| DE | 10 2004 004 765 A1 | 9/2005 |
| DE | 10 2005 007 601 A1 | 9/2005 |
| DE | 10 2006 039 369 A1 | 7/2007 |
| DE | 10 2007 004 303 A1 | 2/2008 |
| DE | 10 2007 004 304 A1 | 7/2008 |
| DE | 10 2007 017 113 A1 | 8/2008 |
| DE | 10 2007 054 039 A1 | 3/2009 |
| DE | 10 2007 062 042 A1 | 6/2009 |
| DE | 10 2008 008 599 A1 | 6/2009 |
| DE | 10 2008 012 844 A1 | 6/2009 |
| DE | 10 2008 013 898 A1 | 6/2009 |
| DE | 10 2008 019 612 A1 | 10/2009 |

(Continued)

*Primary Examiner* — Jerome Jackson, Jr.
*Assistant Examiner* — Bo Fan
(74) *Attorney, Agent, or Firm* — Slater & Matsil, L.L.P.

(57) ABSTRACT

A radiation-emitting device includes a first active semiconductor layer embodied for the emission of electromagnetic radiation and for direct contact with connection electrodes, and a second active semiconductor layer embodied for the emission of electromagnetic radiation and for direct contact with connection electrodes. The first active semiconductor layer and the second active semiconductor layer are arranged in a manner stacked one above another.

13 Claims, 1 Drawing Sheet

(56) References Cited

FOREIGN PATENT DOCUMENTS

| | | |
|---|---|---|
| EP | 1 953 837 A2 | 8/2008 |
| JP | 53-075882 A | 7/1978 |
| JP | 08-172219 A | 7/1996 |
| JP | 2001-077474 A | 3/2001 |
| JP | 2005-216917 A | 8/2005 |
| JP | 2009-522755 A | 6/2009 |
| WO | WO 97/23912 | 7/1997 |
| WO | WO 2005/081319 A1 | 9/2005 |
| WO | WO 2007/076796 | 7/2007 DE |
| WO | WO 2008/092774 A1 | 8/2008 |

* cited by examiner

RADIATION-EMITTING DEVICE

This patent application is a national phase filing under section 371 of PCT/DE2008/002026, filed Dec. 3, 2008, which claims the priority of German patent application 10 2007 060 257.1, filed Dec. 14, 2007, and German patent application 10 2008 013 030.3, filed Mar. 7, 2008, each of which is incorporated herein by reference in its entirety.

TECHNICAL FIELD

The present invention relates to a radiation-emitting device including at least two active semiconductor layers embodied for the emission of electromagnetic radiation.

BACKGROUND

DE 10 2006 039 369 A1 describes a semiconductor body including a first radiation-generating active layer and including a second radiation-generating active layer, wherein the first and the second active layer are arranged one above another in a vertical direction and are electrically connected in series.

SUMMARY

One embodiment of the invention provides a radiation-emitting device with which a high radiation density of the emitted electromagnetic radiation is made possible in a simple manner.

The invention is distinguished by a radiation-emitting device including a first active semiconductor layer embodied for the emission of electromagnetic radiation and for direct contact with connection electrodes, and at least one further active semiconductor layer embodied for the emission of electromagnetic radiation and for direct contact with connection electrodes, wherein the first active semiconductor layer and the further active semiconductor layer are arranged in a manner stacked one above another. The radiation-emitting device, therefore, has, in particular, individually embodied active semiconductor layers, which are also referred to as semiconductor chips, or active semiconductor layers coupled to one another, which together form a layer stack. The direct contact-connection of the active semiconductor layers to connection electrodes enables an embodiment of the radiation-emitting device composed of substrateless semiconductor chips.

This has the advantage that it is possible to achieve a high radiation density and very efficient coupling-out of light in conjunction with high economic viability.

In one advantageous embodiment, the active semiconductor layers include or are formed by at least one pn junction. At least one radiation-generating layer of the active semiconductor layers is then formed, in particular, by a charge carrier recombination zone between a p-doped layer and an n-doped layer. In particular, exactly one charge carrier recombination zone is formed between exactly one p-doped and exactly one n-doped layer. Such active semiconductor layers can be fashioned in the manner described in the document DE 10 2007 004 304 A1, the disclosure content of which, with regard to the semiconductor chip described therein and the active semiconductor layer described therein and also the production method described therein, is hereby incorporated by reference.

The at least one active semiconductor layer can also be understood to mean a semiconductor layer sequence. Alongside the active semiconductor layer, the semiconductor layer sequence can include further functional layers such as electrode layers, tunnel layers, contact layers, lattice matching layers, waveguide layers, cladding layers, charge carrier transport layers and/or charge carrier blocking layers. In this case, the active semiconductor layer can also include or be formed by quantum wells. By way of example, the semiconductor layer sequence is fashioned in the manner described in the document WO 2005/081319 A1, the disclosure content of which, with regard to the semiconductor chip and semiconductor layer sequence described therein, and also the production method described therein is hereby incorporated by reference. Hereinafter, exclusively the expression "active semiconductor layer" is used, even though it can be understood to mean a semiconductor layer sequence including more than one layer.

In a further advantageous embodiment, the at least one active semiconductor layer consists of exactly one p-doped layer and exactly one n-doped layer, at the interface of which a pn junction is formed, which constitutes the radiation-generating layer. It is optionally possible for the active semiconductor layer additionally to include, in particular, exactly one or exactly two metallic layers or reflection layers. By means of the metallic or reflection layers, it is possible, for example, to connect a plurality of active semiconductor layers to one another and to stack them one above another. This holds true, in particular, if the active semiconductor layers to be stacked are fabricated separately from one another.

In a further advantageous embodiment, the radiation-emitting device and/or the at least one active semiconductor layer are/is transparent or semitransparent to at least one part of the generated radiation. In other words, the proportion of the radiation generated and scattered or absorbed in the active semiconductor layer and/or in the radiation-emitting layer is less than 50%, in particular less than 20%, preferably less than 10%.

In a further advantageous embodiment, the first active semiconductor layer and the further active semiconductor layer are embodied in a common semiconductor body. This means that the first active semiconductor layer and the further active semiconductor layer are embodied monolithically with one another, for example, by means of epitaxial growth. In other words, the active semiconductor layers are not fabricated separately from one another and then adhesively bonded, bonded or soldered, for example. This enables simple production of the radiation-emitting device.

In a further advantageous embodiment, the first active semiconductor layer and/or the further active semiconductor layer are/is thermally coupled to a heat-dissipating layer. This constitutes a simple possibility for good dissipation of thermal energy from the first or the further active semiconductor layer to the surroundings.

In a further advantageous embodiment, the first active semiconductor layer and/or the further active semiconductor layer are/is mechanically fixedly coupled to the heat-dissipating layer.

In a further advantageous embodiment, the first active semiconductor layer and the further active semiconductor layer emit radiation having the same wavelength. It is thus possible to achieve a particularly high luminance in a spectral range.

In a further advantageous embodiment, the first active semiconductor layer and the further active semiconductor layer emit radiation having different wavelengths. Light of a mixed color or white light can thus be generated in an efficient manner.

In a further advantageous embodiment, the first active semiconductor layer has a radiation coupling-out area and a reflection layer arranged on a side of the first active semiconductor layer, which is remote from the radiation coupling-out area. This has the advantage that the entire radiation can be directed in such a way that it is emitted in a targeted manner on one side of the radiation-emitting device.

In a further advantageous embodiment, the reflection layer is thermally coupled to the heat-dissipating layer. This has the advantage that a simple and particularly reliable and efficient thermal coupling between the first active semiconductor layer and the heat-dissipating layer is possible.

In a further advantageous embodiment, one or a plurality of further reflection layers are arranged between the active semiconductor layers. The further reflection layers preferably have a refractive index that lies between the refractive indexes of the active semiconductor layers and of the surroundings.

By means of the further reflection layer, the jump in refractive index between the active semiconductor layer and the surroundings thereof is divided in each case into two smaller jumps. In this way, a larger proportion of the radiation can emerge from the active semiconductor layer and enter into the further reflection layer. This part of the radiation can either pass through further active semiconductor layers or be directly emitted through a coupling-out region into the surroundings. On account of the smaller difference in refractive index between the further reflection layer and the surroundings, a larger part of the radiation can be coupled out.

In a further advantageous embodiment, the reflection layer is embodied in electrically conductive fashion. The reflection layer is then, for example, a thin metal layer or a layer of a transparent, electrically conductive material. In the case of a metal layer, the thickness thereof, in a direction perpendicular to a main side of the active semiconductor layer, is preferably at most 30 nm, in particular at most 10 nm. The reflection layer can thus also be embodied as a connection electrode in a simple manner. Moreover, by means of the reflection layer, it is possible for current to be distributed and current to be impressed uniformly over the entire area of the active semiconductor layer. In particular, the reflection layer extends at least over an entire lateral extent of the active semiconductor layer, wherein connection electrodes, other than the reflection layer, which are present, if appropriate, should in this case be counted as being associated with the reflection layer.

In a further advantageous embodiment, most or all of the connection electrodes project beyond the active semiconductor layers in a lateral direction. Preferably, the connection electrodes in this case do not overlap, or do not completely overlap, in a direction parallel to a stacking direction of the active semiconductor layers. This facilitates electrical contact-connection of the active semiconductor layers.

In a further advantageous embodiment, the further active semiconductor layer has a first radiation coupling-out area and a further radiation coupling-out area arranged on a side remote from the first radiation coupling-out area of the further active semiconductor layer. Double-sided radiation-emitting active semiconductor layers and thus also double-sided radiation-emitting devices are thus possible.

In a further advantageous embodiment, one of the radiation coupling-out areas of the further active semiconductor layer faces the radiation coupling-out area of the first active semiconductor layer. This has the advantage that it is possible to generate mixed-colored light or white light with high luminance in a manner featuring either a single-sided or double-sided emission.

In a further advantageous embodiment, the active semiconductor layer has a thickness of between 3 and 20 µm. This has the advantage that a very thin embodiment of the active semiconductor layers and thus of the entire radiation-emitting device is possible.

In a further advantageous embodiment, the active semiconductor layers stacked one above another together have a total thickness of between 6 and 30 µm. This has the advantage that a very thin embodiment of the entire radiation-emitting device is possible.

In a further advantageous embodiment, the radiation-emitting device is embodied as a light-emitting diode. It is thus possible to use substrateless radiation-emitting devices comprising a plurality of active semiconductor layers arranged one above another for light-emitting diodes.

In a further advantageous embodiment, the radiation-emitting device is embodied in areal fashion. In this case, embodied in areal fashion can mean that the radiation-emitting device extends contiguously over an area region including at least an area of a plurality of square millimeters, preferably a plurality of square centimeters and particularly preferably at least one or a plurality of square decimeters or more. By way of example, this radiation-emitting area region includes at least 1 mm$^2$, in particular at least 10 mm$^2$, preferably at least 1 cm$^2$, especially at least 5 cm$^2$. It is thus possible to obtain very flat, substrateless radiation-emitting devices embodied in areal fashion and including a plurality of active semiconductor layers.

In a further advantageous embodiment, the radiation-emitting device has the first active semiconductor layer and at least two further active semiconductor layers, wherein at least one of the active semiconductor layers is embodied for the emission of electromagnetic radiation in the red spectral range, at least one of the active semiconductor layers is embodied for the emission of electromagnetic radiation in the green spectral range and at least one of the active semiconductor layers is embodied for the emission of electromagnetic radiation in the blue spectral range. Light of any desired color and also white light can thus be generated by means of the radiation-emitting device.

In a further advantageous embodiment, lateral dimensions of all the active semiconductor layers are identical, within the scope of the production tolerances. In other words, the active semiconductor layers are stacked congruently one above another. Preferably, mutually adjacent active semiconductor layers are in direct contact with one another, in particular over their entire main areas facing one another. That is to say that the active semiconductor layers touch one another over the entire main areas in this case.

In a further advantageous embodiment, the active semiconductor layers are electrically drivable in each case independently of one another. By way of example, the active semiconductor layers are connected up in the form of an electrical parallel circuit.

In a further advantageous embodiment, the active semiconductor layers are electrically insulated from one another. By way of example, the reflection layer is configured with a dielectric material. Electrically insulated means that there is no direct electrical contact between, in particular, adjacent active semiconductor layers within the semiconductor body.

In a further advantageous embodiment, the radiation-emitting device is free of a conversion means. In other words, the device includes no phosphor or luminescent substance that converts a radiation emitted by the active semiconductor layer into a radiation having a different frequency.

Preferably, the radiation-emitting device is used for illumination purposes. This has the advantage that it is thus possible to realize a compact, space-saving, colored, if appropriate double-sided illumination with flat design that has a high radiation density and a high energetic efficiency.

Preferably, the radiation-emitting device is used for monochrome or multicolored electroluminescent displays. This has the advantage that it is thus possible to realize a compact, space-saving, colored display with flat design having a high radiation density and a high energetic efficiency.

Preferably, the radiation-emitting device is used for projection applications. This has the advantage that it is thus possible to realize a compact, space-saving, colored projector.

BRIEF DESCRIPTION OF THE DRAWINGS

Advantageous configurations of the invention are explained in greater detail below with reference to the schematic drawings.

In the figures.

DETAILED DESCRIPTION OF ILLUSTRATIVE EMBODIMENTS

Elements having an identical construction or function are identified by the same reference symbols throughout the figures. The illustrated elements and their size relationships among one another should not be regarded as true to scale, in principle; rather, individual elements such as, for example, layers, structural parts, components and regions may be illustrated with exaggerated thickness or size dimensions in order that they can be better illustrated and/or for the sake of better understanding.

Figure 1:
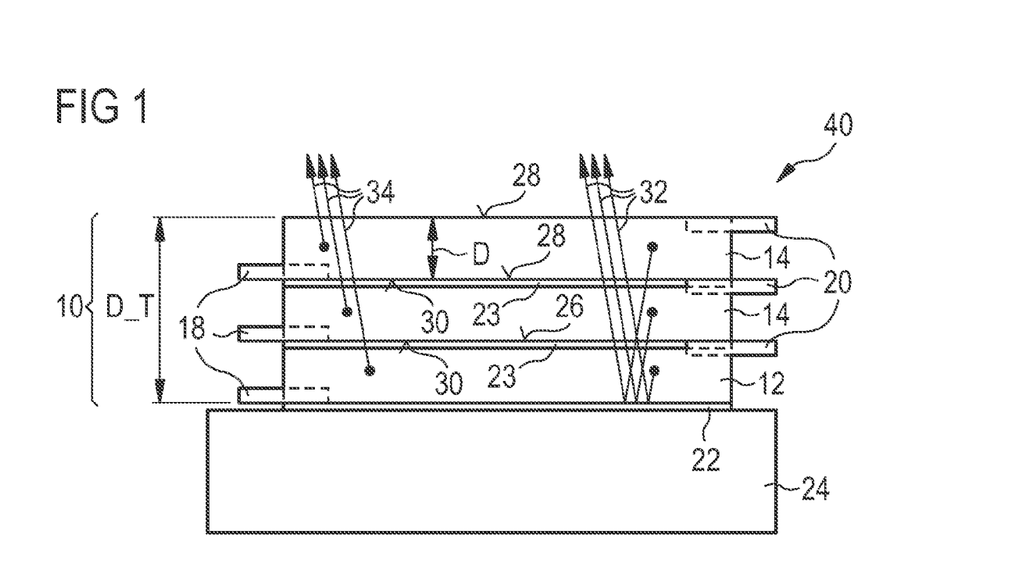
FIG. 1 shows a sectional view of a first embodiment of a radiation-emitting device.
Figure 2:
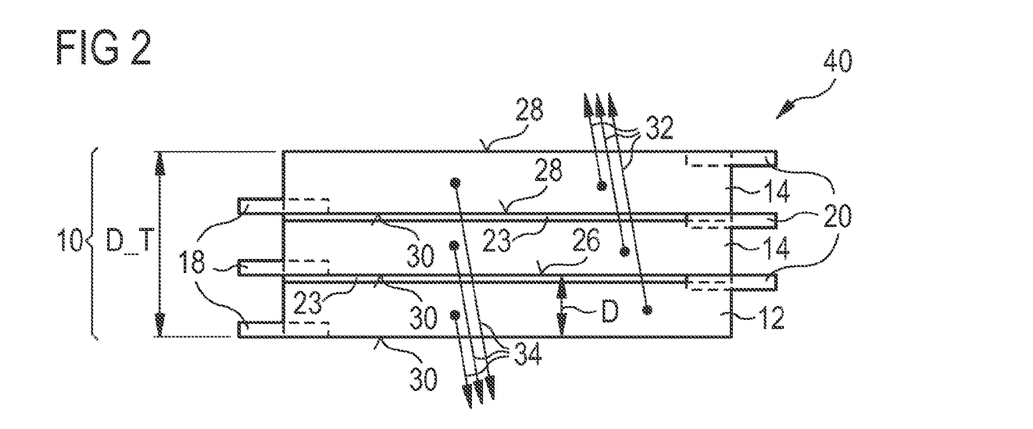
FIG. 2 shows a sectional view of a further embodiment of the radiation-emitting device.

FIGS. 1 and 2 each show exemplary embodiments of a radiation-emitting device 40.

FIG. 1 shows a first embodiment of a radiation-emitting device 40. The radiation-emitting device 40 includes a semiconductor body 10. The semiconductor body 10 has a first active semiconductor layer 12 embodied for the emission of electromagnetic radiation, and further active semiconductor layers 14 embodied for the emission of electromagnetic radiation. The embodiments of the radiation-emitting device 40, which are shown in the figures, each have two further active semiconductor layers 14 embodied for the emission of electromagnetic radiation. However, the number of further active semiconductor layers 14 of the radiation-emitting device 40 can also assume any other value desired.

For the active semiconductor layers 12, 14, semiconductor materials are suitable such as, for example, InAlGaAs, InGaAlP and/or InGaAlN, including the respective binary and ternary compounds such as, for example, GaAs, AlGaAs, GaP, InP, GaAlP, GaN or InGaN. In this case, the respective material need not necessarily correspond to a mathematically exact composition. Rather, it can include one or more dopants and also additional constituents that substantially do not change the physical properties of the material. For the sake of simplicity, however, only the essential constituents of the crystal lattice (Al, Ga, In, P) are mentioned, even if these can be replaced in part by small amounts of further substances.

The active semiconductor layers 12, 14 of the radiation-emitting device 40 preferably have arrangements and structurings of the materials that are known to the person skilled in the art and will, therefore, not be explained any further at this juncture. The active semiconductor layers 12, 14 of the radiation-emitting device 40 are preferably layers grown monolithically. In the active semiconductor layers 12, 14, electromagnetic radiation having an individual wavelength or a range of wavelengths can be generated by electron and hole recombination. In this case, a single-colored, a multicolored and/or a mixed-colored luminous impression can arise for an observer.

The electromagnetic radiation generated by the active semiconductor layers 12, 14 of the radiation-emitting device 40 can have, in particular, a spectrum having wavelengths in an ultraviolet to infrared spectral range. In particular, it may be advantageous if the spectrum includes at least one wavelength visible to an observer. The spectrum of the electromagnetic radiation can advantageously also include a plurality of wavelengths, such that a mixed-colored luminous impression can arise for an observer. For this purpose, it may be possible that the radiation-emitting device 40 itself can generate electromagnetic radiation having a plurality of wavelengths.

The radiation-emitting devices 40 shown are preferably embodied as a light-emitting diode or a light-emitting diode array. The radiation-emitting device 40 is preferably embodied in areal fashion.

The first active semiconductor layer 12 and the further active semiconductor layers 14 are arranged one above another as a layer stack. The active semiconductor layers 12, 14, in particular the first active semiconductor layer 12, are in this case embodied as substrateless layers. Substrateless means here that a carrier layer or substrate layer otherwise present in the radiation-emitting device 40 embodied as a light-emitting diode, for example, is dispensed with. As a result of the arrangement of the first active semiconductor layer 12 and the further active semiconductor layers 14 in a manner stacked one above another, the total quantity of radiation generated can advantageously be very high. Since the dimensions of the radiation-emitting device 40 change only insignificantly by comparison with a single active semiconductor layer and, in particular, the cross section of the radiation-emitting device 40 is independent of the number of active semiconductor layers 12, 14, the radiation density can thus to a large extent also be advantageously high.

The first active semiconductor layer 12 and the further active semiconductor layers 14 are preferably integrated monolithically in the common semiconductor body 10, as is illustrated in the first embodiment of the radiation-emitting device 40 as shown in FIG. 1. Such a monolithic semiconductor body 10 including the active semiconductor layers 12, 14 can be produced in a particularly simple manner.

Preferably, the semiconductor body 10 emits radiation in a vertical direction during operation, wherein the radiation components emitted by the first active semiconductor layer 12 and the further active semiconductor layers 14 are typically mixed.

The active semiconductor layers 12, 14 preferably have a thickness D of between 3 and 20 µm. Particularly preferably, the thickness D of the active semiconductor layers 12, 14 is between 12 and 15 µm. Such thin active semiconductor layers 12, 14 can, on the one hand, still be produced well and the radiation-emitting device 40 can, on the other hand, be made very thin. It is particularly preferred if the active semiconductor layers 12, 14 stacked one above another together have a total thickness D T of between 6 and 30 µm.

Each of the active semiconductor layers 12, 14 has connection electrodes 18, 20 enabling direct electrical contact-connection of the active semiconductor layers 12, 14. Electrical contact-connection of the radiation-emitting device 40 embodied as a light-emitting diode via the carrier layer or substrate layer otherwise present can be avoided here. In particular, the connection electrodes 18, 20 can be embodied in planar fashion or in a manner structured in partial regions.

The connection electrodes 18, 20 are preferably embodied as electrically conductive oxide. The embodiment of the connection electrodes 18, 20 as transparent electrically conductive oxide (transparent conductive oxide, TCO) is particularly preferred.

Transparent electrically conductive oxides are transparent conductive materials, generally metal oxides such as, for example, zinc oxide, tin oxide, cadmium oxide, titanium oxide, indium oxide or particularly preferably indium tin oxide (ITO). Alongside binary metal-oxygen compounds such as, for example, ZnO, $SnO_2$ or $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$ or $In_4Sn_3O_{12}$ or mixtures of different transparent electrically conductive oxides also belong to the group of transparent electrically conductive oxides. Furthermore, the transparent electrically conductive oxides need not necessarily correspond to a stoichiometric composition and can also be p- or n-doped.

In particular, metals such as aluminum, barium, indium, silver, gold, magnesium, calcium or lithium and compounds, combinations and alloys thereof may also be advantageous as material for the connection electrodes.

The connection electrodes 18 arranged in each case below the active semiconductor layers 12, 14 with respect to the figures are preferably embodied as anodes, whereby they can serve as hole-inducing elements.

The connection electrodes 20 arranged in each case above the active semiconductor layers 12, 14 with respect to the figures are preferably embodied as cathodes, and therefore serve as electron-inducing elements.

In the first embodiment of the radiation-emitting device 40 as shown in FIG. 1, a reflection layer 22 is arranged on a side of the first active semiconductor layer 12, which is remote from the further active semiconductor layers 14. The reflection layer 22 can be embodied, for example, as a metallic reflection layer or as a dielectric reflection layer. By means of a dielectric material, the reflection of the impinging radiation is achieved on account of a jump in the refractive index. A dielectric reflection layer can also be embodied as a Bragg mirror.

It is particularly preferred if the reflection layer 22 is embodied in electrically conductive fashion since it is then possible in a simple manner to use the reflection layer 22 as a connection electrode for the first active semiconductor layer 12.

The reflection layer 22 is mechanically and thermally coupled to a heat-dissipating layer 24. The latter serves firstly to enable a fixed mechanical coupling between the active semiconductor layers 12, 14 and the heat-dissipating layer 24. It serves secondly to take up heat that arises in one of the active semiconductor layers 12, 14 and to emit it to the surroundings. Overheating of the active semiconductor layers 12, 14 can thus be avoided. The heat-dissipating layer 24 particularly preferably has a larger lateral extent than the active semiconductor layers 12, 14, in order thus to be able to meet the mechanical and thermal requirements well. The heat-dissipating layer 24 is preferably formed from a material including AlN.

A further reflection layer 23 is arranged between two semiconductor layers 12, 14.

The further reflection layer 23 preferably has a refractive index that lies between the refractive index of the semiconductor layers 12, 14 and that of the surroundings thereof. The further refection layer 23 is transparent to the generated radiation. A suitable material is silicon dioxide, for example.

The further reflection layer 23 has the effect firstly that a larger proportion of radiation coming from a semiconductor layer 12, 14 can leave the semiconductor layer 12, 14 and can penetrate into the further reflection layer 23. From the further reflection layer 23, the radiation can either enter into a further semiconductor layer 12, 14 and subsequently leave the radiation-emitting device 40 through a radiation coupling-out area, as will be described below. The coupling-out efficiency is increased by means of the further reflection layer 23.

The first active semiconductor layer 12 has a radiation coupling-out area 26. The further active semiconductor layers 14 each have a first radiation coupling-out area 28 and a further radiation coupling-out area 30 arranged on a side remote from the first radiation coupling-out area 28 of the further active semiconductor layer 14.

The function of the embodiment of the radiation-emitting device 40 in FIG. 1 is briefly explained below:

First electromagnetic radiation components 32 are generated in the active semiconductor layers 12, 14 and emitted in the direction of the heat-dissipating layer 24, reflected at the reflection layer 22 and then emerge from the radiation-emitting device 40 via the radiation coupling-out area 26 of the first active semiconductor layer 12 and the radiation coupling-out areas 28 of the further active semiconductor layers 14. The active semiconductor layers 12, 14 are embodied in such a way that they are in each case transparent to the electromagnetic radiation components 32 from the adjacent active semiconductor layers 12, 14.

Furthermore, a second electromagnetic radiation component 34 generated in the active semiconductor layers 12, 14 emerges from the radiation-emitting device 40 directly via the radiation coupling-out area 26 of the first active semiconductor layer 12 and the radiation coupling-out areas 28 of the further active semiconductor layers 14.

The substrateless radiation-emitting device 40 of the embodiment in FIG. 1, which is constructed from active semiconductor layers 12, 14, is thus embodied with single-sided emission.

In the embodiment illustrated in FIG. 2, the active semiconductor layers 12, 14 are likewise constructed without a carrier layer, that is to say in substrateless fashion, and are embodied as individual, separate semiconductor chips. In this case, it is thus possible, by means of any desired combination of individual active semiconductor layers 12, 14, which are embodied as substrateless semiconductor chips and which are arranged one above another as a layer stack, to construct in each case a radiation-emitting device 40 adapted in a suitable manner.

In the embodiment of the radiation-emitting device 40 as shown in FIG. 2, each of the active semiconductor layers 12, 14 can in each case emit radiation substantially in two directions by means of two radiation coupling-out areas 26, 28, 30.

The first electromagnetic radiation components 32 are generated in the active semiconductor layers 12, 14 and then emerge from the radiation-emitting device 40 via the radiation coupling-out area 26 of the first active semiconductor layer 12 and the first radiation coupling-out areas 28 of the further active semiconductor layers 14.

Furthermore, the second electromagnetic radiation components 34 are generated in the active semiconductor layers 12, 14 and then emerge from the radiation-emitting device 40 via the further radiation coupling-out areas 30 of the further active semiconductor layers 14 and the further radiation coupling-out area 30 of the first active semiconductor layer 12.

This means that the substrateless radiation-emitting device 40 shown in FIG. 2, composed of active semiconductor layers 12, 14, is embodied with double-sided emission. Owing to the possibility of coupling out light on both sides, an internal reflective coating of the active semiconductor layers 12, 14 can be dispensed with, and the reflection layer can be obviated.

If the first active semiconductor layer 12 and the further active semiconductor layers 14 emit radiation having the same wavelength, then a particularly high radiation density of the radiation-emitting device 40 can thus be made possible.

By contrast, if the first active semiconductor layer 12 and the further active semiconductor layers 14 are embodied in such a way that they each emit radiation having different wavelengths, then it is possible by means of the radiation-emitting device 40, in a very simple manner, to generate colored mixed light or white light.

If at least one of the active semiconductor layers 12, 14 is embodied for the emission of electromagnetic radiation in the red spectral range, a further one of the active semiconductor layers 12, 14 is embodied for the emission of electromagnetic radiation in the green spectral range and at least one of the further active semiconductor layers 12, 14 is embodied for the emission of electromagnetic radiation in the blue spectral range, then colored mixed light or white light can be produced in a particularly simple manner.

For the purpose of improved coupling-out of the radiation, the first radiation coupling-out area 28 of the outer further active semiconductor layer 14 can have a roughening or some other structure that impedes total reflection at the radiation coupling-out area. The radiation power coupled out via the first radiation coupling-out area 28 of the outer further active semiconductor layer 14 can then be increased. Instead of the roughening, it is also possible to provide a surface structuring, for instance, in the form of microprisms or other means for reducing total reflection losses at the radiation coupling-out area.

Furthermore, the radiation-emitting device 40 can have optical elements disposed downstream of the outer further active semiconductor layer 14 in the emission direction of the electromagnetic radiation. In particular, a circular polarizer can be arranged, for instance, on the outer side of the outer further active semiconductor layer 14, by means of which circular polarizer it is advantageously possible to avoid a situation where light that is radiated into the radiation-emitting device 40 from outside and that can be reflected at the connection electrodes 18, 20, for example, can emerge again from the radiation-emitting device 40.

The radiation-emitting devices 40 described can enable a high economic viability by virtue of the already described advantages of a high radiation density and a high efficiency.

The radiation-emitting devices 40 shown may be suitable for use in display and/or illumination devices, which are distinguished by a compact, space-saving and flat design.

Substrateless radiation-emitting devices 40 embodied as light-emitting diodes and including a plurality of active semiconductor layers 12, 14 arranged one above another are preferably used, in particular, for illumination purposes, especially for large-area illumination, for example, of rooms.

A further field of use is displays for automobiles or mobile telephones, touch screen displays and the like. These displays are preferably embodied as monochrome or multicolored electroluminescent displays.

Furthermore, radiation-emitting devices 40 embodied as light-emitting diodes can be used for projectors. With the radiation-emitting devices 40 described here, such projectors can be of very small and compact construction.

The invention is not restricted to the exemplary embodiments by the description on the basis thereof. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting device comprising:
   a first active semiconductor layer embodied for the emission of electromagnetic radiation of a first wavelength and for direct contact with connection electrodes;
   a second active semiconductor layer embodied for the emission of electromagnetic radiation of a second wavelength, which is different from the first wavelength, and for direct contact with connection electrodes, wherein the first active semiconductor layer and the second active semiconductor layer are arranged in a manner stacked one above another, wherein the first and second semiconductor layers are made of InAlGaAs, InGaAlP or InGaAlN, including the respective binary and ternary compounds, and wherein a material of the first semiconductor layer is different from a material of the second semiconductor layer,
   and wherein the first active semiconductor layer and the second active semiconductor layer are embodied as individual, separate semiconductor chips; and
   a first reflection layer arranged between the first active semiconductor layer and second active semiconductor layer, wherein the first reflection layer comprises indium-tin oxide, cadmium oxide, titanium oxide, ZnO, SnO$_2$, In$_2$O$_3$, Zn$_2$SnO$_4$, CdSnO$_3$, ZnSnO$_3$, MgIn$_2$O$_4$, GaInO$_3$, Zn$_7$In$_2$O$_5$, or mixtures thereof, wherein a jump in refractive index between the first and second active semiconductor layers and a region surrounding thereof is divided into two smaller jumps in refractive index by the first reflection layer, wherein the first active semiconductor layer has a radiation coupling-out area and a second reflection layer arranged on a side of the first active semiconductor layer that is remote from the radiation coupling-out area, wherein the radiation coupling-out area is a main side of the first active semiconductor layer and faces the second active semiconductor layer, and wherein the second reflection layer is embodied as a metallic or dielectric reflection layer.

2. The radiation-emitting device as claimed in claim 1, further comprising a heat-dissipating layer thermally coupled to the first active semiconductor layer and/or the second active semiconductor layer.

3. The radiation-emitting device as claimed in claim 1, wherein the first active semiconductor layer and the second active layer semiconductor layer emit radiation having different wavelengths.

4. The radiation-emitting device as claimed in claim 1, wherein the second reflection layer is thermally coupled to a heat-dissipating layer.

5. The radiation-emitting device as claimed in claim 1, wherein the first active semiconductor layer and the second active semiconductor layer each has a thickness of between 3 and 20 μm.

6. The radiation-emitting device as claimed in claim 1, wherein the first and second active semiconductor layers stacked one above another together have a total thickness of between 6 and 30 μm.

7. The radiation-emitting device as claimed in claim 1, wherein the radiation-emitting device is embodied in areal fashion.

8. The radiation-emitting device as claimed in claim 1, further comprising a third active semiconductor layer, wherein the first active semiconductor layer is embodied for the emission of electromagnetic radiation in a red spectral range, the second active semiconductor layer is embodied for the emission of electromagnetic radiation in a green spectral range and the third active semiconductor layer is embodied for the emission of electromagnetic radiation in a blue spectral range.

9. A method of generating radiation, the method comprising:

providing a first active semiconductor layer, which is embodied for the emission of electromagnetic radiation of a first wavelength, in direct contact with connection electrodes, and a second active semiconductor layer, which is embodied for the emission of electromagnetic radiation of a second wavelength, in direct contact with connection electrodes, wherein the second wavelength is different from the first wavelength, wherein the first active semiconductor layer and the second active semiconductor layer are stacked one above another, wherein the first and second semiconductor layers are made of InAlGaAs, InGaAlP or InGaAlN, including the respective binary and ternary compounds, wherein a material of the first semiconductor layer is different from a material of the second semiconductor layer, and wherein the first active semiconductor layer and the second active semiconductor layer are embodied as individual, separate semiconductor chips;

providing a first reflection layer arranged between the first active semiconductor layer and second active semiconductor layer, wherein the first reflection layer comprises indium-tin oxide, cadmium oxide, titanium oxide, ZnO, $SnO_2$, $In_2O_3$, $Zn_2SnO_4$, $CdSnO_3$, $ZnSnO_3$, $MgIn_2O_4$, $GaInO_3$, $Zn_7In_2O_5$ or mixtures thereof, wherein a jump in refractive index between the first and second active semiconductor layers and a region surrounding thereof is divided into two smaller jumps in refractive index by the first reflection layer, wherein the first active semiconductor layer has a radiation coupling-out area and a second reflection layer arranged on a side of the first active semiconductor layer that is remote from the radiation coupling-out area, wherein the radiation coupling-out area is a main side of the first active semiconductor layer and faces the second active semiconductor layer, and wherein the second reflection layer is embodied as a metallic or dielectric reflection layer; and applying a voltage to the connection electrodes so that the first active semiconductor layer emits electromagnetic radiation of the first wavelength and the second active semiconductor layer emits electromagnetic radiation of the second wavelength.

10. The method as claimed in claim 9, wherein applying a voltage comprises generating electromagnetic radiation for illumination purposes.

11. The method as claimed in claim 9, wherein applying a voltage comprises generating electromagnetic radiation for a monochrome or multicolored electroluminescent display.

12. The method as claimed in claim 9, wherein applying a voltage comprises generating electromagnetic radiation for a projection application.

13. The method as claimed in claim 9, further comprising providing a third active semiconductor layer stacked with the first and second active semiconductor layers, wherein applying a voltage to the connection electrodes comprises causing the first active semiconductor layer to emit red electromagnetic radiation, the second active semiconductor layer to emit green electromagnetic radiation and the third active semiconductor layer to emit blue electromagnetic radiation.

* * * * *

UNITED STATES PATENT AND TRADEMARK OFFICE
CERTIFICATE OF CORRECTION

PATENT NO. : 8,648,357 B2  
APPLICATION NO. : 12/747459  
DATED : February 11, 2014  
INVENTOR(S) : Siegfried Herrmann Page 1 of 1

It is certified that error appears in the above-identified patent and that said Letters Patent is hereby corrected as shown below:

In the Claims

In Col. 10, line 30, claim 1, delete "$GaInO_3Z_{n7}In_2O_5$" and insert -- $GaInO_3Z_{n2}In_2O_5$ --.

In Col. 11, line 32, claim 9, delete "$GaInO_3Z_{n7}In_2O_5$" and insert -- $GaInO_3Z_{n2}In_2O_5$ --.

Signed and Sealed this  
Twenty-second Day of April, 2014

Michelle K. Lee  
*Deputy Director of the United States Patent and Trademark Office*

UNITED STATES PATENT AND TRADEMARK OFFICE
CERTIFICATE OF CORRECTION

PATENT NO. : 8,648,357 B2  Page 1 of 1
APPLICATION NO. : 12/747459
DATED : February 11, 2014
INVENTOR(S) : Siegfried Herrmann It is certified that error appears in the above-identified patent and that said Letters Patent is hereby corrected as shown below:

In the Claims

In Col. 10, line 30, claim 1, delete "$GaInO_3, Zn_7In_2O_5$" and insert -- $GaInO_3, Zn_2In_2O_5$ --.

In Col. 11, line 32, claim 9, delete "$GaInO_3, Zn_7In_2O_5$" and insert -- $GaInO_3, Zn_2In_2O_5$ --.

This certificate supersedes the Certificate of Correction issued April 22, 2014.

Signed and Sealed this
Sixteenth Day of February, 2016

Michelle K. Lee
*Director of the United States Patent and Trademark Office*

UNITED STATES PATENT AND TRADEMARK OFFICE
CERTIFICATE OF CORRECTION

| | |
|---|---|
| PATENT NO. | : 8,648,357 B2 |
| APPLICATION NO. | : 12/747459 |
| DATED | : February 11, 2014 |
| INVENTOR(S) | : Siegfried Herrmann |

It is certified that error appears in the above-identified patent and that said Letters Patent is hereby corrected as shown below:

On the Title Page, item 73 Assignee, line 1, delete "OSRAM Opto Semiconductor GmbH," and insert --OSRAM Opto Semiconductors GmbH,--.

Signed and Sealed this
Ninth Day of August, 2016

Michelle K. Lee
*Director of the United States Patent and Trademark Office*